United States Patent [19]

Bogard et al.

[11] Patent Number: 4,916,401

[45] Date of Patent: Apr. 10, 1990

[54] METHOD AND APPARATUS FOR TESTING FASTENER ARCING AND SPARKING

[75] Inventors: James K. Bogard, Renton; Michael J. Katzer; Diane L. Heidlebaugh, both of Seattle, all of Wash.

[73] Assignee: The Boeing Company, Seattle, Wash.

[21] Appl. No.: 193,937

[22] Filed: May 12, 1988

[51] Int. Cl.$^4$ ............................................. G01R 31/12
[52] U.S. Cl. .................................. 324/536; 346/107 R; 324/538
[58] Field of Search ............... 324/500, 538, 536, 456, 324/72; 346/107 R, 107 MP

[56] References Cited

U.S. PATENT DOCUMENTS

| | | | |
|---|---|---|---|
| 1,795,175 | 3/1931 | Lloyd | 346/130 |
| 2,586,815 | 2/1952 | Gunn | 324/551 |
| 2,653,073 | 9/1953 | Messerly | 346/107 |
| 2,795,738 | 6/1957 | Holliday | 346/107 |
| 3,196,445 | 7/1965 | Trolio | 346/107 |
| 3,859,711 | 1/1975 | McKiddy | 324/538 |
| 3,991,302 | 11/1976 | Danner | 324/73 PC |
| 4,507,605 | 3/1985 | Geisel | 324/501 |

*Primary Examiner*—Reinhard J. Eisenzopf
*Assistant Examiner*—Maura K. Regan
*Attorney, Agent, or Firm*—Seed and Berry

[57] ABSTRACT

A method and apparatus for testing arcing and/or sparking of a fastener installed in a carbon fiber composite (CFC) panel. The fasteners are installed in a test panel which is attached to a light-tight enclosure including a camera. Current is injected to the fasteners through current injection tabs attached to each of the fasteners from the outside of the enclosure. As the current level injected from a current source is varied, the camera records images of the manner in which electrical arcing and/or sparking occurs between the fastener and the test panel.

8 Claims, 3 Drawing Sheets

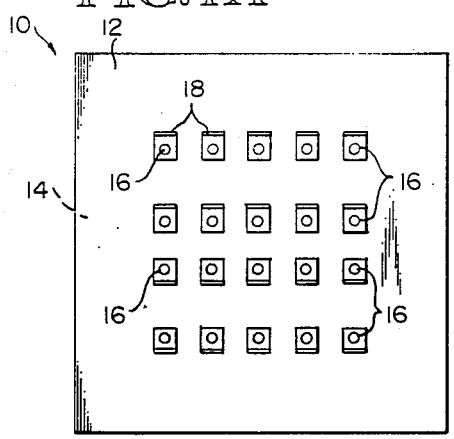
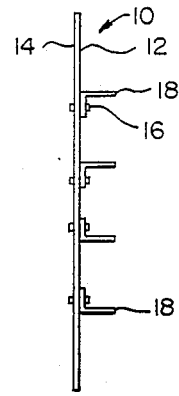
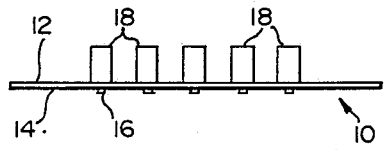
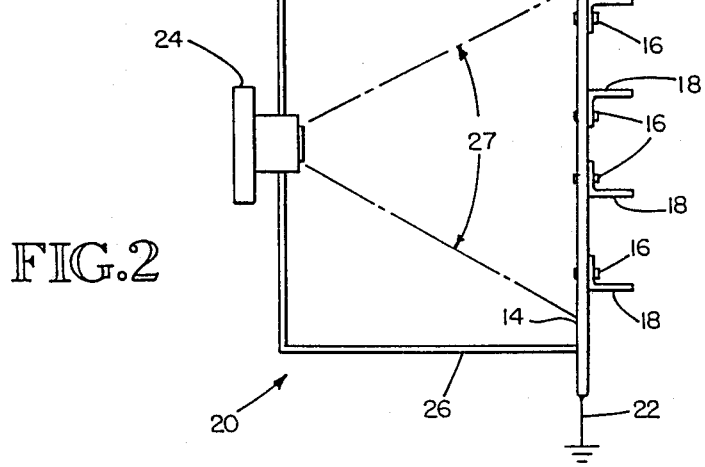

4,916,401

METHOD AND APPARATUS FOR TESTING FASTENER ARCING AND SPARKING

TECHNICAL FIELD

This invention relates to a method and apparatus for testing fastener arcing and sparking, and more particularly, to a method and apparatus for testing arcing and sparking of fasteners when the fasteners are installed in a panel of a material.

BACKGROUND ART

There is a great deal of interest in how metal fasteners installed in carbon fiber composite (CFC) aircraft structures respond to high levels of electrical currents conducted through them. Specifically, the concern is about the discharge pattern of arcing and/or sparking occurring as a result of the electrical current passing through the fastener installation. This concern exists because of the ignition hazard which is present when current-caused arcing and/or sparking occurs in a hazardous ignitable vapor area such as fuel tanks in airplanes.

Much laboratory testing has been done in an effort to determine the arcing and/or sparking characteristics of fastener installations in response to conducted electrical currents. The results of these laboratory tests have not been conclusive enough to establish a reasonable confidence in test-determined fastener arc and/or spark current threshold levels.

The primary difficulty in obtaining reliable test data centers around being able to develop a test method which generates data that is not filled with so many unknown variables that it defies analysis. To date, substantial portions of test data have had to be looked upon with suspicion and caution or totally disregarded because of the discovery that some aspect of the test setup or method has influenced, masked, or otherwise called into question the reliability of the test data.

Being able to accurately determine arcing and/or sparking characteristics of fastener installations is important to protecting CFC aircraft from fuel tank ignition caused by electrical current conduction through these fastener installations. Future CFC aircraft must be protected from electrical current-caused arcing and/or sparking resulting from currents introduced to the CFC structure from lightning, electromagnetic pulse (EMP) and nuclear EMP coupling, or electrical system fault currents. Therefore, it can be important to not only recognize the conditions under which arcing and/or sparking occurs, but also to systematically study the locations which are most susceptible to arcing and/or sparking.

As disclosed by Gunn in U.S. Pat. No. 2,586,815, it has long been known to recognize and optically record the breakdown of the electrical insulation in an antenna attached to a radio receiver. This is accomplished by an indicator and recorder which can both cause recognizable audio signals in the receiver and produce an observable and recordable light signal. However, this indicator and recorder are incapable of producing images of the breakdown which can be analyzed in order to determine its likelihood of occurring subsequently.

It is therefore desirable to have a method and an apparatus for systematically producing images of the arcing and/or sparking characteristics of typical fastener installations.

DISCLOSURE OF THE INVENTION

It is an object of the present invention to provide an apparatus and a method for systematically and easily studying the arcing and/or sparking characteristics of installed fasteners.

It is another object of the present invention to provide an apparatus for producing images of the arcing and/or sparking characteristics of installed fasteners.

It is yet another object of the present invention to facilitate the study of the arcing and/or sparking characteristics of several installed fasteners under substantially identical conditions.

To satisfy these objects, an absolutely controlled variable test method and apparatus must be developed. To be acceptable, the test method and apparatus must permit the generation of test data that is free from influence from the test method and apparatus. The test method and apparatus must be such that the apparatus allows only the fastener installation arcing and/or sparking to be observed without confusion from arcing and/or sparking produced by the apparatus itself.

According to one aspect, the invention is an apparatus for testing arcing and sparking of fasteners used with panels of a material, the panels having a first side and a second side opposed to the first side. The apparatus comprises a light-tight enclosure having walls at least partially including a replaceable panel of the material, the replaceable panel having at least one of the fasteners passing from the first side to the second side of the panel. The apparatus further comprises imaging means for producing an image of the light generated by any sparking or arcing that may be induced within the enclosure by an electrical current and means for producing an electrical current through the fastener.

In another aspect, the invention is a method for testing arcing and sparking of fasteners used with panels of a material, the panels having a first side and a second side opposed to the first side. The method comprises the step of (a) producing a light-tight enclosure having walls at least partially including a replaceable panel of the material, the replaceable panel having at least one of the fasteners passing from the first side to the second side of the panel. The method also comprises the steps of (b) positioning an imaging means in the proximity of the light-tight enclosure, the imaging means producing an image of the light generated by any sparking or arcing that may be induced within the enclosure by an electrical current and (c) producing an electrical current in the fastener.

BRIEF DESCRIPTION OF THE DRAWINGS

FIG. 1A is a plan view of a test panel used in conjunction with one embodiment of the apparatus of the invention.

FIG. 1B is a front elevational view of a test panel used in conjunction with one embodiment of the apparatus of the invention.

FIG. 1C is a top elevational view of a test panel used in conjunction with one embodiment of the apparatus of the invention.

FIG. 2 is a schematic cross-sectional view of the apparatus of one embodiment of the present invention.

BEST MODE FOR CARRYING OUT THE INVENTION

Figure 3:
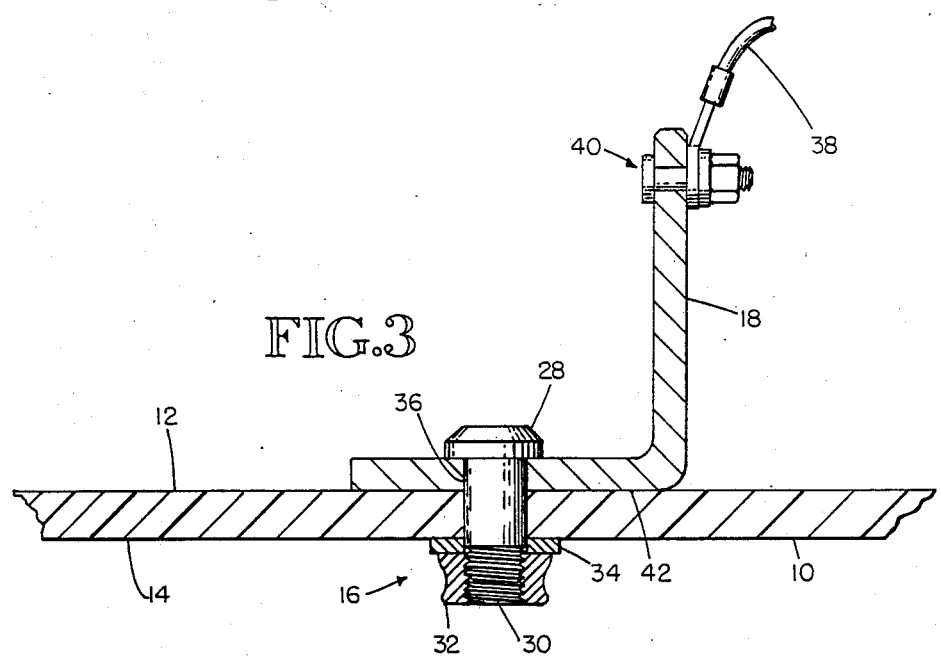
FIG. 3 is a closeup cross-sectional view of an installation of a first fastener.

Referring to FIGS. 1A-C, an important part of the apparatus of the present invention, the test panel 10, is made from a section of the material in which the fasteners are to be used. For example, the test panel 10 can be made from a sheet of carbon fiber composite (CFC) material having a first side 12 and a second side 14. In most installations, there may be no distinction between the two sides of the test panel, but in some, the first side 12 may be made using a different surface layer than the second side 14. For example, the first side 12 may have a smooth finish or a metal-plated fabric as its surface layer, while the second side 14 does not.

The test panel 10 can have a plurality of fasteners 16 attached thereto. The fasteners 16 can be arranged in a systematic pattern, so that subsequent arcing and/or sparking can be correlated with the location of the fastener causing the light. The pattern can be square, as shown, or any other pattern which will allow the desired tests to be performed. Attached to each of the fasteners 16 is a current injection tab 18 which allows current to be directly injected into a specific one of the fasteners by being connected directly to a current source (not shown). The tests can be performed among the fasteners in any desired order, depending upon the purposes of the tests. The current injection tabs 18 all project from the same side of the test panel 10 (for example, first side 12) so that they can be accessed when the test panel 10 is installed on the test apparatus of the invention.

In FIG. 2, the test panel 10 is shown installed on the apparatus of the invention, generally indicated by the reference numeral 20, and electrically grounded through ground 22. The test apparatus 20 is an enclosure which includes the test panel 10, which can be removably attached thereto. When the removable test panel 10 is attached to the apparatus 20, the interior of the apparatus 20 defines light conditions which allow an imaging device to obtain images of the second side 14. The imaging device can, for example, be a video camera or a photographic camera 24. The portion of the test panel 10 which can be imaged by camera 24 is located within field 27, and includes the portion of the fasteners 16 projecting through the test panel 10 from the exterior of the apparatus 20.

FIG. 3 is a closeup cross-sectional view of a first installation of a fastener 16 in the test panel 10. The fasteners 16 to be tested will generally have a head end 28 and a threaded end 30, and are held in place by means of a nut 32. If desired, the load imposed upon the test panel 10 by the nut 32 can be distributed over a larger area by means of a washer 34. The current injection tab 18 includes a hole 36 through which the fastener 16 passes. The current injection tab 18, which can conduct electrical current, is also connected to a lead wire 38 by fastener 40. Lead wire 38, in turn, is connected to a conventional current supply (not shown) having the capacity to produce currents at the levels which cause arcing and/or sparking. The arcing and/or sparking caused by the injected current will be at the interfaces between the fastener 16 and the test panel 10. In the situation depicted in FIG. 3, the arcing and/or sparking of interest will occur between the washer 34 and the test panel 10 as well as between the nut 32 and the test panel 10. Any arcing and/or sparking which occurs between the nut 32, the washer 34, and the test panel 10 can be photographically recorded by the camera 24.

Figure 4:
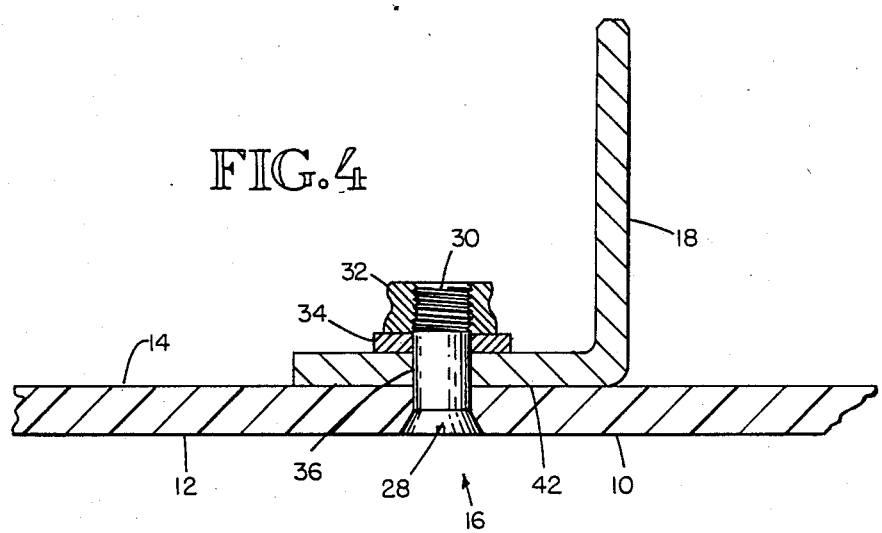
FIG. 4 is a closeup cross-sectional view of an installation of a second fastener.

It is also of interest to record any arcing and/or sparking which occurs between the head end 28 of a fastener 16 and the test panel 10. As shown by the closeup cross-sectional view of the installation of a second fastener in FIG. 4, the test panel 10 can be attached to the test apparatus 20 so that the first side 12 of the test panel is directed toward its interior. This will be necessary only if the first side 12 is different from the second side 14. The fasteners can, of course, have countersunk heads, as shown in FIG. 4, or conventional heads, as shown in FIG. 3. In the installation shown in FIG. 4, the arcing and/or sparking to be studied will be between the head 28 and the test panel 10. The current will be injected through a lead wire (not shown in FIG. 4), connected to a current source.

Figure 5:
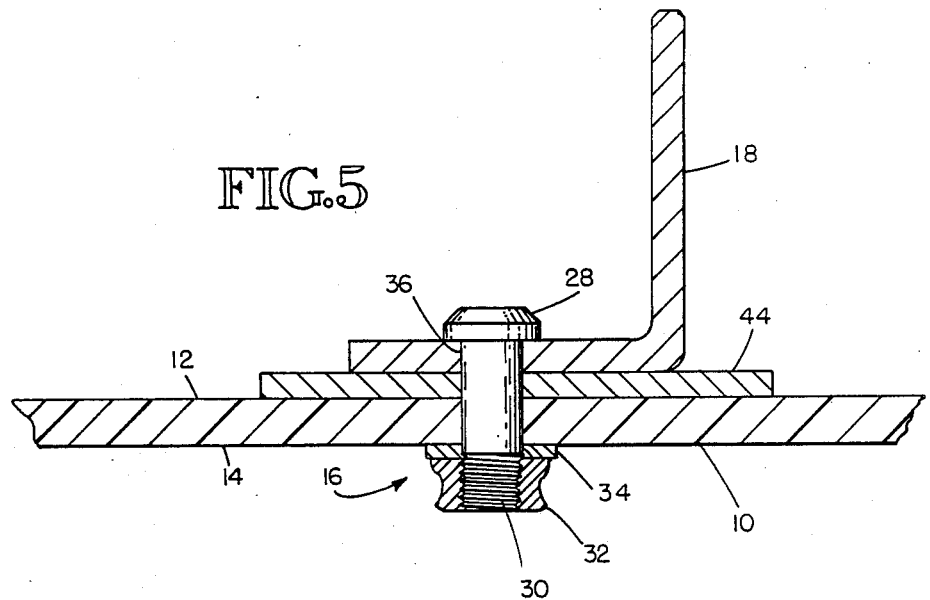
FIG. 5 is a closeup cross-sectional view of a second installation of the fastener shown in FIG. 3.

The installations shown in FIGS. 3 and 4 can possibly be subject to error due to currents injected into the test panel 10 from the current injection tab 18 through the faying surface 42 (i.e., the adjoining surfaces of the current injection tab 18 and the test panel 10). In order to obviate this source of injected current, the installation shown in FIG. 5 can be used. In this installation, the current injection tab 18 is separated from the test panel 10 by a dielectric barrier 44 which eliminates the faying surface between the current injection tab 18 and the test panel 10. Where warranted, this installation will insure that the arcing and/or sparking recorded by the camera 24 in the test apparatus 20 will be only that due to currents passing from the fastener 16 to the test panel 10.

Figure 6:
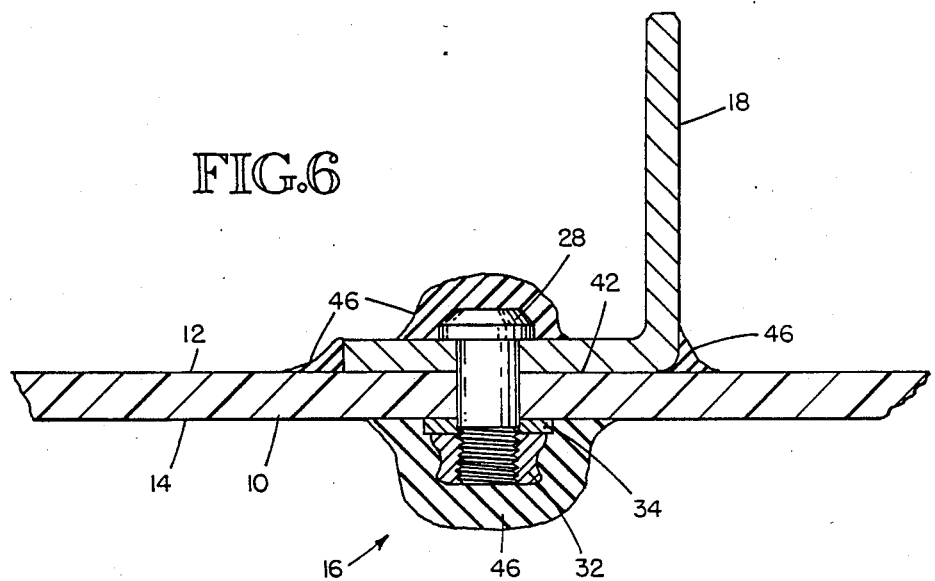
FIG. 6 is a closeup cross-sectional view of a third installation of the fastener shown in FIG. 3.

It is possible to simulate any kind of fastener installation with this test method. Any fasteners which can be used with a panel made from a structural material (such as CFC) can be installed in a test panel 10 made from the material and used in conjunction with the test apparatus 20, as shown in FIG. 2. In particular, as shown in the installation of FIG. 6, it is possible to test a fastener 16 which has been installed with the use of fuel tank sealant 46 which covers the fastener 16 as well as surrounding portions of the test panel 10 and the current tab 18.

While the foregoing detailed descriptions have described the best known modes of practicing the invention, one skilled in the art will readily appreciate that various modifications of the above-described embodiments may be made without departing from the spirit and the scope of the invention. Accordingly, the spirit and the scope of the present invention are to be limited only by the following claims.

We claim:

1. An apparatus for testing arcing and sparking of fasteners used with panels of a material, the panels having a first side and a second side opposed to the first side, comprising:

a light-tight enclosure having walls at least partially including a replaceable panel of the material, the replaceable panel having at least one of the fasteners passing from the first side to the second side of the panel;

imaging means for producing an image of the light generated by any sparking or arcing that may be induced within the enclosure by an electrical current; and means for producing an electrical current through the fastener.

2. The apparatus of claim 1, further including current generating means for introducing an electrical current into the at least one fastener, the current generating means being connectable to the at least one fastener.

3. The apparatus of claim 1 wherein the at least one fastener passes through the removable panel at a predetermined position on the panel.

4. The apparatus of claim 1 wherein the imaging means is a photographic camera adapted to be sensitive to and to retain an image of any light produced by sparking or arcing that may be induced by the electrical current.

5. The apparatus of claim 4 wherein the photographic camera is contained within the enclosure.

6. A method for testing arcing and sparking of fasteners used with panels of a material, the panels having a first side and a second side opposed to the first side, comprising the steps of:
 (a) producing a light-tight enclosure having walls, at least partially including a replaceable panel of the material, the replaceable panel having at least one of the fasteners passing from the first side to the second side of the panel;
 (b) positioning an imaging means in the proximity of the light-tight enclosure, the imaging means producing an image of the light generated by any sparking or arcing that may be induced within the enclosure by an electrical current; and
 (c) producing an electrical current in the fastener.

7. The method of claim 6 wherein step (c) comprises connecting a current generator to the fastener and operating the current generator.

8. A method for testing arcing and sparking of fasteners used with panels of a material, the panels having a first side and a second side opposed to the first side, comprising the steps of:
 (a) producing a light-tight enclosure having walls at least partially including a replaceable panel of the material, the replaceable panel having at least one of the fasteners passing from the first side to the second side of the panel;
 (b) positioning an imaging means in the proximity of the light-tight enclosure, the imaging means producing an image of the light generated by any sparking or arcing that may be induced within the enclosure by an electrical current; and
 (c) connecting a current generator to a portion of the fastener which extends outside the enclosure and operating the current generator to produce an electrical current in the fastener.

* * * * *

UNITED STATES PATENT AND TRADEMARK OFFICE
CERTIFICATE OF CORRECTION

PATENT NO. : 4,916,401
DATED : April 10, 1990
INVENTOR(S) : James K. Bogard et al.

It is certified that error appears in the above-identified patent and that said Letters Patent is hereby corrected as shown below:

At col. 1, line 4, insert:

--This invention was made with Government support under Contract No. F33657-81-C-0067 awarded by the Air Force. The Government has certain rights in this invention.--

Signed and Sealed this

Eighth Day of December, 1992

Attest:

DOUGLAS B. COMER

*Attesting Officer*    Acting Commissioner of Patents and Trademarks